United States Patent
Jiang et al.

(10) Patent No.: US 11,935,623 B2
(45) Date of Patent: Mar. 19, 2024

(54) APPARATUS FOR CONTROLLING ACCESS TO A MEMORY DEVICE AND MEMORY SYSTEM COMPRISING THE SAME

(71) Applicant: MONTAGE TECHNOLOGY (KUNSHAN) CO., LTD., Suzhou (CN)

(72) Inventors: Yibo Jiang, San Jose, CA (US); Leechung Yiu, San Jose, CA (US); Christopher Cox, San Jose, CA (US); Robert Xi Jin, San Jose, CA (US); Lizhi Jin, San Jose, CA (US); Leonard Datus, San Jose, CA (US)

(73) Assignee: MONTAGE TECHNOLOGY (KUNSHAN) CO., Suzhou (CN)

( * ) Notice: Subject to any disclaimer, the term of this patent is extended or adjusted under 35 U.S.C. 154(b) by 155 days.

(21) Appl. No.: 17/852,344

(22) Filed: Jun. 28, 2022

(65) Prior Publication Data

US 2023/0420020 A1 Dec. 28, 2023

(51) Int. Cl.
*G11C 7/24* (2006.01)
*G11C 7/02* (2006.01)
*G11C 7/10* (2006.01)
*G11C 11/406* (2006.01)

(52) U.S. Cl.
CPC ............ *G11C 7/24* (2013.01); *G11C 7/02* (2013.01); *G11C 7/1048* (2013.01); *G11C 7/1063* (2013.01); *G11C 7/109* (2013.01); *G11C 11/406* (2013.01)

(58) Field of Classification Search
CPC ....... G11C 7/02; G11C 7/1018; G11C 7/1063; G11C 7/109; G11C 7/24; G11C 11/406
See application file for complete search history.

(56) References Cited

U.S. PATENT DOCUMENTS

| | | | |
|---|---|---|---|
| 10,950,288 B2 * | 3/2021 | Nale | G11C 11/4096 |
| 11,087,819 B2 * | 8/2021 | Cowles | G11C 11/408 |
| 2022/0223195 A1 * | 7/2022 | Ayyapureddi | G06F 21/554 |
| 2023/0236968 A1 * | 7/2023 | Gieske | G06F 12/0895 711/118 |
| 2023/0393992 A1 * | 12/2023 | Akel | G06F 12/0864 |

* cited by examiner

*Primary Examiner* — Son L Mai

(74) *Attorney, Agent, or Firm* — Jun He Law Offices P.C; James J. Zhu

(57) ABSTRACT

An apparatus for controlling access to a memory device comprising rows of memory units is provided. The apparatus comprises: an operation monitor configured to track memory operations to the rows of memory units of the memory device; a row hammer counter configured to determining, for each of the rows of memory units, row hammer effects experienced by the row of memory units due to the memory operations to the other rows of memory units of the memory device; a mitigation module configured to initiate, for each of the rows of memory units, row hammer mitigation in case that accumulated row hammer effects experienced by the row of memory units reach a predetermined threshold; and a virtual host module configured to perform the row hammer mitigation targeting a row of memory units in response to the initiation of row hammer mitigation for the row of memory units by the mitigation module.

13 Claims, 2 Drawing Sheets

APPARATUS FOR CONTROLLING ACCESS TO A MEMORY DEVICE AND MEMORY SYSTEM COMPRISING THE SAME

TECHNICAL FIELD

The application generally relates to memory technology, and particularly to an apparatus for controlling access to a memory device and a memory system comprising such apparatus.

BACKGROUND

Almost all currently available memory systems such as double date rate (DDR), low power DDR (LPDDR), graphics DDR (GDDR) and high bandwidth memory (HBM) systems have row hammer problem. Row hammer is a security exploit that takes advantage of an unintended and undesirable side effect in dynamic random-access memory (DRAM) in which memory cell rows interact electrically between themselves by leaking their charges, possibly changing the contents of nearby memory cell rows that were not addressed in the original memory access. This circumvention of the isolation between DRAM memory units results from the high cell density in modern DRAM memory systems, and can be triggered by specially crafted memory access patterns that rapidly activate the same memory rows numerous times.

A potential method for row hammer mitigation is to have an embedded monitor and counter for each row targeting the activate commands (or activate commands in some instance) in the DDR, LPDDR, GDDR and HBM memory systems. This method still has several concerns. A major concern is that the memory systems must duplicate the cost of the monitor and counter for each row, and duplicate the cost of the row hammer mitigation scheduling, victim rows refreshing and counter reset logic.

Thus, there is a need for further improvement to the existing memory systems.

SUMMARY

An objective of the present application is to provide a memory system with a cost effective row hammer mitigation mechanism.

In an aspect of the present application, there is provided an apparatus for controlling access to a memory device comprising rows of memory units. The apparatus comprises: an operation monitor configured to track memory operations to the rows of memory units of the memory device; a row hammer counter configured to determining, for each of the rows of memory units, row hammer effects experienced by the row of memory units due to the memory operations to the other rows of memory units of the memory device; a mitigation module configured to initiate, for each of the rows of memory units, row hammer mitigation in case that accumulated row hammer effects experienced by the row of memory units reach a predetermined threshold; and a virtual host module configured to perform the row hammer mitigation targeting a row of memory units in response to the initiation of row hammer mitigation for the row of memory units by the mitigation module.

In some embodiments, the row hammer counter is further configured to determine, for each of the rows of memory units, row hammer effects experienced by the row of memory units according to the memory operations to one or more rows of memory units adjacent to the row of memory units.

In some embodiments, the row hammer counter comprises: a lower-level counter configured to determine row hammer effects experienced by all the rows of memory units, and; a higher-level counter configured to determine row hammer effects experienced by a portion of the rows of memory units for which row hammer effects determined by the lower-level counter exceeds a predetermined threshold.

In some embodiments, the operation monitor is configured to track memory operations to the rows of memory units of the memory device by tracking activate commands issued by a host device coupled to the memory device.

In some embodiments, the row hammer counter comprises a plurality of counter each being assigned to a row of memory units.

In some embodiments, the mitigation module comprises a plurality of row hammer mitigation engines each being coupled to one of the plurality of counters.

In some embodiments, the mitigation module comprises a mitigation arbiter coupled between the plurality of row hammer mitigation engines and the virtual host module, and the mitigation arbiter is configured to schedule the initiation of row hammer mitigation for the respective rows of memory units.

In some embodiments, the apparatus further comprises: an alert generator coupled to the mitigation module, and configured to generate an alert signal and send it to a host device to signal the row hammer mitigation operation being performed within the memory device.

In some embodiments, the alert generator is coupled to the host device via one of the following: Alert_n pin, QLBD (loopback data output) bus or QLBS (loopback data strobe) bus.

In some embodiments, the mitigation module is further configured to reset a counter count for a row of memory units when the accumulated row hammer effects experienced by the row of memory units reach a predetermined threshold.

In some embodiments, the apparatus is integrated within a registering clock driver.

In another aspect of the present application, there is provided a memory system. The memory system includes at least one memory module; and the apparatus of the above aspect.

The foregoing is an overview of the present application, which may simplify, summarize, and omit details. Those skilled in the art will appreciate that this section is merely illustrative and not intended to limit the scope of the present application in any way. This summary section is neither intended to identify key features or essential features of the claimed subject matter nor intended to act as an auxiliary means for determining the scope of the claimed subject matter.

BRIEF DESCRIPTION OF THE DRAWINGS

The foregoing and other features of the present application will be more fully understood from the following description and the appended claims taken in conjunction with the accompanying drawings. It is to be understood that these drawings depict only a few embodiments of the contents of the present application and should not be construed as limiting the scope of the present application. The contents of the present application will be illustrated more clearly and in more detail with the accompanying drawings.

DETAILED DESCRIPTION OF THE EMBODIMENTS

Figure 1:
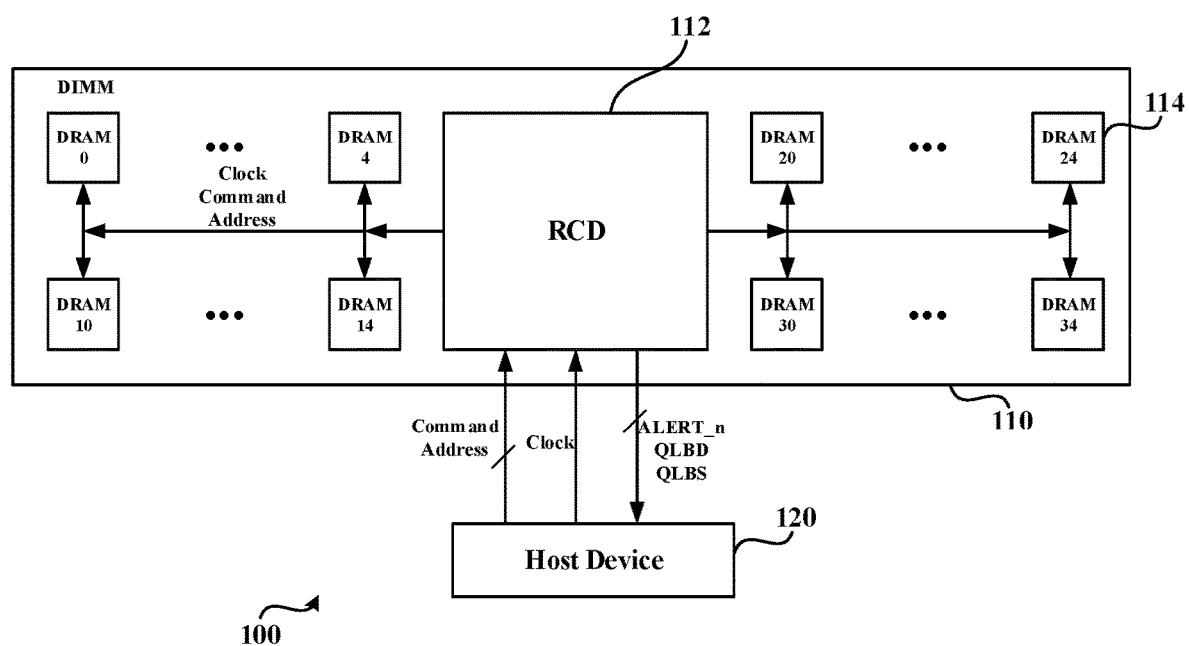
FIG. 1 shows a memory system according to an embodiment of the present application.

In the following detailed description, reference is made to the accompanying drawings which form a part hereof. In the drawings, similar reference numerals generally refer to similar parts unless the context clearly dictates otherwise. The illustrative embodiments described in the detailed description, drawings and claims are not intended to be limiting. Other embodiments may be employed and other changes may be made without departing from the spirit or scope of the subject matter of the present application. It is to be understood that various configurations, substitutions, combinations and designs of the various forms of the present application, which are generally described in this application and are illustrated in the drawings, are intended to constitute a part of the present application.

FIG. 1 shows an electronic device 100 having a memory system 110 according to an embodiment of the present application. As shown in FIG. 1, the memory system 110 has a memory device having one or more memory modules 114, and a local control module such as a registering clock driver (RCD) 112 for controlling access to the one or more memory modules 114. The memory modules 114 can be disposed on a printed circuit board as a double inline memory module (DIMM), and interface with a host device 120 such as a central processing unit (CPU) via a memory interface, so as to exchange data between the host device 120 and the memory system 110. In certain embodiments, the memory system 110 may be a memory system compatible with the JEDEC DDR SDRAM standard, including the JEDEC DDR2, DDR3, DDR4, DDR5 or any other DDR standards, and accordingly the interface may be a DDR interface.

In the embodiment shown in FIG. 1, the memory modules 114 of the memory system 110 includes DRAM memory modules 0 to 4, DRAM memory modules 10 to 14, DRAM memory modules 20 to 24 and DRAM memory modules 30 to 34. The memory modules 114 constitute a memory device having a plurality of rows of memory units. The rows of memory units can be addressed by respective data access commands. When a row of memory units is addressed to be accessed by the host device 120, before the data access command is received, an activate command is issued from the host device 120 to the RCD 112 to activate or open the row(s) of memory units for subsequent data access. For example, the JEDEC Standard JESD79-5A published in October, 2021 defines an exemplary activate command. In particular, the activate command is issued with command/address (CA) pins CA0 and CA1 being low. Coincident with the activate command, address bits are issued to select a bank group, a bank or a row of the memory system 110 which is to be activated. In an example, the value on the BG[2:0] pins in the X4/8 ballout format or the value on the BG[1:0] pins in the X16 ballout format can be used to select a bank group of the memory system 110; the value on the BA[1:0] pins can be used to select a bank within a bank group; the address provided on the other appropriate CA pins for R[17:0] can be used to select a specific row which is to be activated. The selected row(s) of memory units may remain active (or open) for access until a pre-charge command is issued or a pre-charge all command is issued. A bank should be pre-charged before opening a different row in the same bank.

Since the activate command can be indicative of the data access operation to a row of memory units of the memory device, which is initially received and processed by the RCD 112 from the host device 120, an integrated monitoring and row hammer mitigation mechanism can be deployed within the RCD 112 as elaborated below. The centralized monitoring mechanism can avoid duplicating the cost of monitors and counters for separate rows of memory units, thereby reducing the cost for implementing such mechanism.

Figure 2:
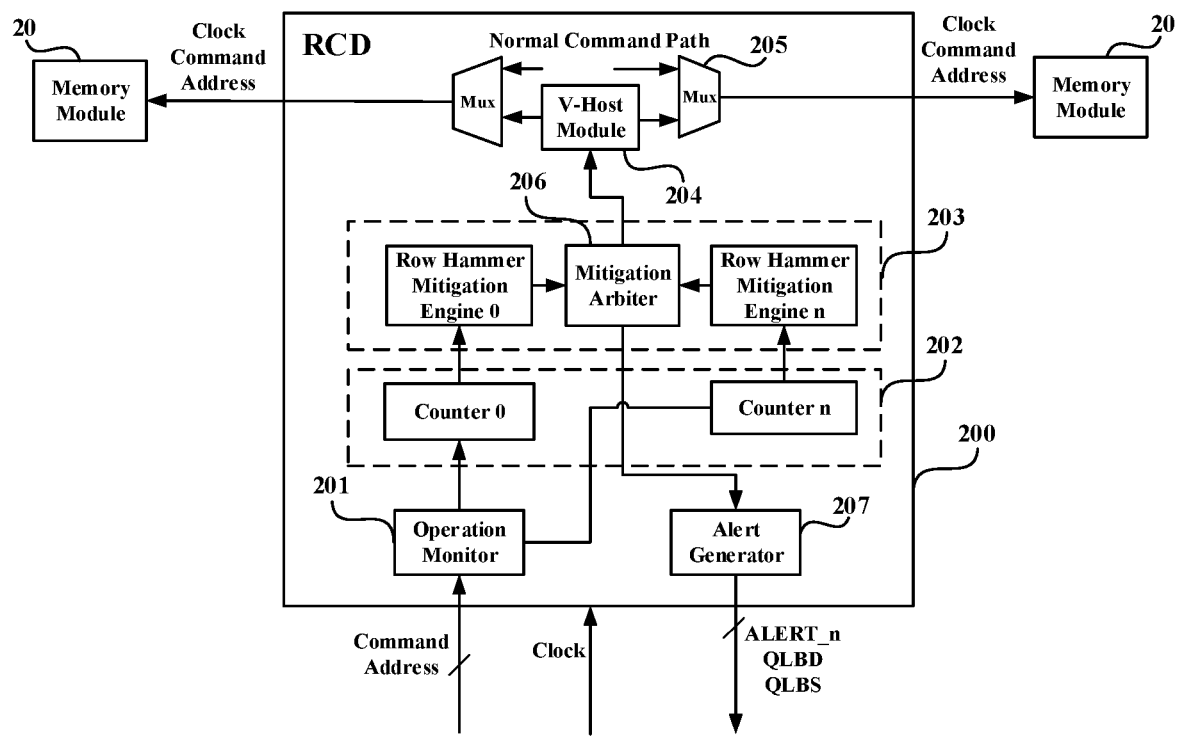
FIG. 2 shows an apparatus for controlling access to a memory device according to an embodiment of the present application.

FIG. 2 shows an apparatus for controlling access to a memory device 20 according to an embodiment of the present application. The memory device 20 includes rows of memory units which can be addressed by data access commands, and the memory device 20 can include the memory modules 114 as shown in FIG. 1, or include a single memory module. The apparatus can be integrated within a local control module such as the RCD 112 shown in FIG. 1.

As shown in FIG. 2, the apparatus includes an operation monitor 201 which tracks memory operations to the rows of memory units of the memory device 20. In particular, the memory operations can be signaled by an activate command received from a host device (not shown) through certain predefined CA pins. The activate commands are used for activating data access operations to respective rows of memory units of the memory device 20, which signals the start of the memory operation to the specific rows in the memory device 20. In some embodiments, the operation monitor 201 can be deployed at an upstream of a signal path within the apparatus so as to monitor any activate commands received for addressing any rows of memory units of the memory device 20. In the embodiment, the operation monitor 201 is coupled to the CA pins, which is in parallel with a normal command path within the RCD 112. The normal command path is used for transmitting data access signals or commands from the host device to the memory device 20 for normal data access operations. The activate commands can cause read/write operations to certain memory units according to the row addressed, which may affect the charges in the addressed row of memory units. Due to the high density of memory units in nowadays memory devices, the read/write operation may further affect the charges of the memory units in rows which are adjacent to the addressed row, at least to some extent. The effect that nearby rows of memory units adversely affect each other is called as row hammer. The rows adjacent to the addressed row are referred to as victim rows which are affected, while the row addressed by the activate command is referred to as an aggressor row which affects the other rows. When the addressed row is activated for several times, the victim rows adjacent thereto need to be refreshed before the charge leakage blurs the actual value associated with the charges stored in their memory units. It can be appreciated that range of victim rows may change depending on the density of the memory units in the memory device, the manufacturing process for the memory device, and some other physical factors. In some examples, the victim row(s) can include a predetermined range of four most adjacent rows to an aggressor row, if the memory operation to the aggressor row may affect these four most adjacent rows. For example, if the aggressor row is row i which is located in the middle of the memory device, then the victim rows may include row (i−2), row (i−1), row (i+1) and row (i+2). In other words, some other rows which are not so close to row i may not be significantly affected by the operation to row i, and thus the row hammer damage to these rows may be ignored. It can be appreciated that the range of victim rows may be configured or adjusted in practice. In an example, if more adjacent rows are likely to be affected by the addressed row, then the range of victim rows can be set larger. In some other examples, if the adjacent rows are not likely to be affected by the addressed row, the predetermined range of victim rows can be set smaller. In other words, the range of aggressor rows for a victim row may be configured or adjusted similarly. If a row of the memory device may be affected by the memory operations to more adjacent rows, then the range of aggressor rows can be set larger; if a row of the memory device may be affected by the memory operations to fewer adjacent rows, then the range of aggressor rows can be set smaller.

The operation monitor 201 may be coupled to a row hammer counter 202 to transmit information regarding the memory operations monitored by the operation monitor 201. As such, the row hammer counter 202 can determine, for each of the rows of memory units, row hammer effects experienced by the row of memory units due to the memory operations to the other rows of memory units of the memory device. In an embodiment, the row hammer counter 202 may count the activate commands addressing the respective rows of memory units of the memory device, i.e., the activate commands targeting the aggressor rows. As mentioned above, since the victim rows are related with the respective aggressor rows, a further conversion may be desired to record the row hammer effects experienced by the rows of memory units when they operate as the "victim row" instead of as the "aggressor".

Table 1 below shows an exemplary row hammer effect count or victim count indicative of the row hammer effect experienced by respective rows. As shown in Table 1, each row of the memory device is assigned with a counter which is a part of the row hammer counter, i.e., row 0 assigned with counter 0, row 1 assigned with counter 1 . . . row i assigned with counter i . . . and row n assigned with counter n. Therefore, a counter count in counter 2 may increase by 1, for example, when an aggressor row for row 2 is addressed and activated by an activate command. At this time, row 2 is the victim row. The aggressor row for row 2 may be four adjacent rows, i.e., rows 0-1 and 3-4, for example. Accordingly, a victim count or row hammer effect count may be maintained and may change if any of rows 0-1 and rows 3-4 is activated. For example, the victim count for row 2 may increase by 1 if row 1 is addressed and activated. The row hammer effect experienced by a row is in positive relationship with the victim count. In some other examples, the victim count may be weighted for each victim row because the aggressor row's influence on the victim row may be different depending on the distance from the aggressor row to the victim row. For example, the row hammer effect experienced by row 2 when row 1 is addressed may be greater than the row hammer effect experienced by row 2 when row 0 is addressed, because row 1 is closer to row 2 than row 0. Accordingly, a weighted victim count may be obtained by weighting the different influence factors. For example, the victim count for row 2 may increase by 2 when row 1 or row 3 is addressed, while the victim count for row 2 may increase by 1 when the row 0 or row 4 is addressed, as shown in Table 1. In some embodiments, a weighting module or submodule may be deployed within each counter to achieve the appropriate weighting of influence factors.

TABLE 1

Row Hammer Effect Count or Victim Count

| Counter No. | Victim Row | Aggressor Row | Victim Count | Weighted Victim Count |
|---|---|---|---|---|
| Counter 0 | Row 0 | Row 0 | N/A | N/A |
| | | Row 1 | +1 | +2 |
| | | Row 2 | +1 | +1 |
| Counter 1 | Row 1 | Row 0 | +1 | +2 |
| | | Row 1 | N/A | N/A |
| | | Row 2 | +1 | +2 |
| | | Row 3 | +1 | +1 |
| Counter 2 | Row 2 | Row 0 | +1 | +1 |
| | | Row 1 | +1 | +2 |
| | | Row 2 | N/A | N/A |
| | | Row 3 | +1 | +2 |
| | | Row 4 | +1 | +1 |
| . . . | . . . | . . . | . . . | . . . |
| Counter i | Row i | Row i − 2 | +1 | +1 |
| | | Row i − 1 | +1 | +2 |
| | | Row i | N/A | N/A |
| | | Row i + 1 | +1 | +2 |
| | | Row i + 2 | +1 | +1 |
| . . . | . . . | . . . | . . . | . . . |
| Counter n | Row n | Row n − 2 | +1 | +1 |
| | | Row n − 1 | +1 | +2 |
| | | Row n | N/A | N/A |

In some embodiments, the row hammer counter 202 may be a single module integrating the counter functions for all the rows of memory units in the memory device. However, in some other embodiments, the row hammer counter 202 may be consisting of multiple separate counters such as counter 0 to counter n as shown in FIG. 2. In such case, the operation monitor 201 may be coupled to the (n+1) counters to transmit information regarding the receipt of the respective activate commands.

Since the row hammer counter 202 needs to determine the row hammer effects experienced by all the rows of memory units in the memory device 20, each row should be assigned with a counter count. Therefore, if the counter counts are of a bigger bit-width such as 16-bit, 32-bit or higher, all the counter counts may take up too much storage space which is relatively limited in the local control module or RCD 200. Moreover, it is unlikely that all the rows of memory units are equally affected during memory operations to the memory device 202, because in most cases only a small number of rows of memory units which store relevant data may be mutually affected by their neighboring rows that are addressed.

In order to reduce the undesired occupancy of storage space in the local control module or RCD 200, the row hammer counter 202 may be divided into two parts. A first part of the row hammer counter 202 can be a lower-level counter which is used for determining and recoding the row hammer effects for all the rows of memory units. However, the counter counts may be of a small bit-width such as 4-bit or 8-bit. It can be appreciated that, for the distributed counter structure of the row hammer counter 202 as shown in FIG. 2, the lower-level counter can be divided into multiple lower-level counter subunits for the respective counter 0 to counter n. Also, it can be appreciated that, in some other alternative embodiments, a single counter may include multiple counter values, each of which can be assigned for a row of memory units. A second part of the row hammer counter 202 can be a higher-level counter which is "dynamically" assigned to one or more rows for which the counter counts of the lower-level counter subunits exceed a predetermined threshold, so as to determine and record the row hammer effects experienced by such rows. The counter counts in the higher-level counter indicate that the corresponding rows may be affected more than the remaining rows which are not assigned with the higher-level counters of row hammer counter 202. As mentioned above, since only a smaller number of rows may be accumulatively affected by the memory operations to the other rows over a period, the number of counter counts configured within the higher-level counter may be small, at least much smaller than the number of counter counts in the lower-level counter subunits. In some examples, the count of the higher-level counter may be of a greater bit-width such as 16-bit, 32-bit or higher. In that case, if the higher-level counter for certain row of memory units still exceeds another predetermined threshold, indicating that such row of memory units has experienced significant row hammer effects and thus needs row hammer mitigation.

Still referring to FIG. 2, the apparatus further includes a mitigation module 203. The mitigation module 203 is configured to initiate, for each of the rows of memory units of the memory device, row hammer mitigation in case that accumulated row hammer effects experienced by the row of memory units reach a predetermined threshold. In an embodiment, the mitigation module 203 is coupled to the row hammer counter 202 to receive the counter counts indicating the determined row hammer effects experienced by the rows of memory units of the memory device 20.

In some embodiments such as the embodiment shown in FIG. 2, the mitigation module 203 may be divided into separate mitigation engines, and each of the mitigation engines may be coupled to a respective counter. In other words, each row hammer mitigation engine can track the row hammer effects experienced by a row of memory units and act accordingly. If the accumulated row hammer effects for a row of memory units reaches or is greater than a predetermined threshold, the mitigation module 203 can generate a mitigation command for the row of memory units. In some embodiments, the mitigation module 203 may further generate a counter reset command and send the counter reset command to the corresponding counter. In this way, the counter count in the counter can be reset, because the corresponding row of memory units will be refreshed soon and the previously accumulated row hammer effects can be eliminated. After being reset, the counter can be allowed to continue to determine the row hammer effects for the corresponding row of memory units again. It can be appreciated that the mitigation module 203 may store the predetermined threshold for determining whether or not to initiate the row hammer mitigation. In the example shown in Table 1 where the row hammer counts are measured in integer format, the predetermined threshold may be a predetermined integer such as 100, 200, 500, 1000 or any other appropriate numbers. In some embodiments, the predetermined threshold can be adjusted depending on the characteristics of the memory device. For example, the predetermined threshold for a higher-density memory chip may be greater than that for a lower-density memory chip, or the predetermined threshold for a higher-supply voltage memory chip may be greater than that for a lower-supply voltage memory chip.

In some embodiments, the mitigation module 203 may be divided into two or more row hammer mitigation engines, and each row hammer mitigation engine can be corresponding to two or more rows of memory units. For example, each row hammer mitigation engine may be corresponding to the rows of memory units in a memory rank, to the rows of memory units in a memory sub-channel, to the rows of memory units in a bank group, or to the rows of memory units in a memory bank.

The apparatus further includes a virtual host module 204. The virtual host module 204 is coupled to the mitigation module 203 to receive the mitigation command. The virtual host module 204 can perform the row hammer mitigation targeting a row of memory units in response to the initiation of row hammer mitigation for the row of memory units by the mitigation module 203. In some embodiments, the virtual host module 204 can issue refresh commands or other pre-programmed row hammer mitigation command sequences, which can be compatible with the format of commands defined in the DDR standards. Since the virtual host module 204 is integrated within the RCD 200, it is not needed to receive from the "real" host device which is external to the memory system the commands to mitigate row hammer effects in the memory device 20, thereby reducing the workload of the host device. As the downstream of the signal path of the apparatus, the virtual host module can be coupled to the memory module 20 through a multiplexer 205. The normal command path is also coupled to the memory device 20 through the multiplexer 205, which is in parallel with the signal path of the apparatus. Therefore, the multiplexer 205 can be switched to connect the virtual host module 204 to the memory device 20, or to connect the normal command path from the external host device to the memory device 20.

In the embodiment shown in FIG. 2, the mitigation module 203 further includes a mitigation arbiter 206. The mitigation arbiter 206 can be coupled between the row hammer mitigation engines 0 to n and the virtual host module 204. In some events, two or more rows of memory units may be similarly affected by other aggressor rows and thus their respective counters may reach the predetermined threshold simultaneously. For example, counter 0 and counter 4 may both reach the predetermined threshold and thus row hammer mitigation engine 0 and row hammer mitigation engine 4 may both generate a mitigation command. In some embodiments, the mitigation arbiter 206 can schedule the mitigation commands for the respective rows of memory units to avoid traffic in the virtual host module 204. In some other embodiments, the mitigation arbiter 206 can forward the mitigation commands for the respective rows of memory units to the virtual host module 204 simultaneously such that the virtual host module can refresh the corresponding rows of memory units simultaneously.

In some embodiments, the mitigation module 203 can be coupled to an alert generator 207. The alert generator 207 can generate an alert signal and send it to the external host device. In this way, the external host device can be signaled of the row hammer mitigation operation being performed within the memory system. The alert generator 207 may be coupled to the host device via certain pins defined in the existing standards. For example, the Alert_n pin, the QLBD (loopback data output) bus or the QLBS (loopback data strobe) bus can be used for transmitting the alert signals. The existing DDR standards defined an alerting function for Alert_n, i.e., if there is error in CRC, then Alert_n goes LOW for a period time interval and then goes back HIGH. The QLBD bus and the QLBS bus have similar signal output capabilities, and thus can be used for signaling the performance of row hammer mitigation. Since the Alert_n pin in the existing standards is multi-purposed with other functions such as command bus parity error checking, write CRC error checking, etc., proper priorities can be configured in the apparatus to determine which type of signal is being sent to the host device when multiple functions are triggered at the same time. The alert generator 207 can send static LOW or HIGH values for variant time, or specific toggling patterns to signal the host device for different functions. It can be appreciated that when the host device receives the alert signal which is indicative of an on-going row hammer mitigation, it may rest the communication with the RCD 200 for a period of time, to allow the complete performance of the internal row hammer mitigation operation in the memory system. In this way, a row hammer handling state machine or other similar row hammer mitigation mechanism of the host device may not be mis-triggered.

In some embodiments, the communication between the alert generator 207 and the host device can be bi-directional, and the host device can therefore send to the alert generator 207 a mitigation command, for example, when the host device is notified of the significant row hammer effects for certain victim rows. The alert generator 207 can pass the mitigation command to the virtual host module 204 through the mitigation module 203. Once receiving the mitigation command, the virtual host module 204 can responsively perform the row hammer mitigation targeting the victim rows suffering row hammer damages. In this way, the host device does not have to read back the counts from the row hammer counter 202, which reduces the workload of the host device.

It should be noted that although several modules or sub-modules of the apparatus for apparatus for controlling access to a memory device according to embodiments of the present application are described in the above description, this division is merely exemplary rather than mandatory. In fact, according to the embodiments of the present application, features and functions of two or more modules described above may be embodied in one module. Conversely, features and functions of one module described above can be further divided into a plurality of modules.

Those skilled in the art will be able to understand and implement other variations to the disclosed embodiments by studying the specification, the application, the drawings and the appended claims. In the claims, the words "include" or "including" do not exclude other elements and steps, and the words "a" or "an" do not exclude the plural. In the practical application of the present application, one part may perform the functions of a plurality of technical features cited in the claims. Any reference numerals in the claims should not be construed as limiting the scope.

What is claimed is:

1. An apparatus for controlling access to a memory device, wherein the memory device comprises rows of memory units, the apparatus comprising:
   an operation monitor configured to track memory operations to the rows of memory units of the memory device;
   a row hammer counter configured to determining, for each of the rows of memory units, row hammer effects experienced by the row of memory units due to the memory operations to the other rows of memory units of the memory device;
   a mitigation module configured to initiate, for each of the rows of memory units, row hammer mitigation in case that accumulated row hammer effects experienced by the row of memory units reach a predetermined threshold; and
   a virtual host module configured to perform the row hammer mitigation targeting a row of memory units in response to the initiation of row hammer mitigation for the row of memory units by the mitigation module.

2. The apparatus of claim 1, wherein the row hammer counter is further configured to determine, for each of the rows of memory units, row hammer effects experienced by the row of memory units according to the memory operations to one or more rows of memory units adjacent to the row of memory units.

3. The apparatus of claim 1, wherein the row hammer counter comprises:
   a lower-level counter configured to determine row hammer effects experienced by all the rows of memory units, and;
   a higher-level counter configured to determine row hammer effects experienced by a portion of the rows of memory units for which row hammer effects determined by the lower-level counter exceeds a predetermined threshold.

4. The apparatus of claim 1, wherein the operation monitor is configured to track memory operations to the rows of memory units of the memory device by tracking activate commands issued by a host device coupled to the memory device.

5. The apparatus of claim 1, wherein the row hammer counter comprises a plurality of counter each being assigned to a row of memory units.

6. The apparatus of claim 5, wherein the mitigation module comprises a plurality of row hammer mitigation engines each being coupled to one of the plurality of counters.

7. The apparatus of claim 6, wherein the mitigation module comprises a mitigation arbiter coupled between the plurality of row hammer mitigation engines and the virtual host module, and the mitigation arbiter is configured to schedule the initiation of row hammer mitigation for the respective rows of memory units.

8. The apparatus of claim 1, further comprising:
   an alert generator coupled to the mitigation module, and configured to generate an alert signal and send it to a host device to signal the row hammer mitigation operation being performed within the memory device.

9. The apparatus of claim 8, wherein the alert generator is coupled to the host device via one of the following: Alert_n pin, QLBD (loopback data output) bus or QLBS (loopback data strobe) bus.

10. The apparatus of claim 1, wherein the mitigation module is further configured to reset a counter count for a row of memory units when the accumulated row hammer effects experienced by the row of memory units reach a predetermined threshold.

11. The apparatus of claim 1, wherein the mitigation module is further configured to initiate, for each of the rows of memory units, row hammer mitigation when a mitigation command is received from a host device coupled to the memory device.

12. The apparatus of claim 1, wherein the apparatus is integrated within a registering clock driver.

13. A memory system, comprising:
   at least one memory module comprising rows of memory units; and
   an apparatus for controlling access to the at least one memory module; wherein the apparatus comprises:
   an operation monitor configured to track memory operations to the rows of memory units of the at least one memory module;
   a row hammer counter configured to determining, for each of the rows of memory units, row hammer effects experienced by the row of memory units due to the memory operations to the other rows of memory units of the at least one memory module;
a mitigation module configured to initiate, for each of the rows of memory units, row hammer mitigation in case that accumulated row hammer effects experienced by the row of memory units reach a predetermined threshold; and
a virtual host module configured to perform the row hammer mitigation targeting a row of memory units in response to the initiation of row hammer mitigation for the row of memory units by the mitigation module.

* * * * *